United States Patent
Li et al.

(10) Patent No.: US 7,081,326 B2
(45) Date of Patent: Jul. 25, 2006

(54) NEGATIVE PHOTORESIST AND METHOD OF USING THEREOF

(75) Inventors: Wenjie Li, Poughkeepsie, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/798,157

(22) Filed: Mar. 11, 2004

(65) Prior Publication Data

US 2005/0202339 A1     Sep. 15, 2005

(51) Int. Cl.
 G03C 1/73   (2006.01)
 G03F 7/038  (2006.01)
 G03F 7/20   (2006.01)
 G03F 7/30   (2006.01)
 G03F 7/36   (2006.01)

(52) U.S. Cl. .................. 430/270.1; 430/325; 430/311; 430/313; 430/329; 430/905; 430/906; 430/907; 430/910; 430/914; 430/921; 430/922

(58) Field of Classification Search ............ 430/270.1, 430/325, 905, 906, 907, 910, 914, 921, 922, 430/311, 313, 329
See application file for complete search history.

(56) References Cited

U.S. PATENT DOCUMENTS 6,074,801 A * 6/2000 Iwasa et al. ............. 430/270.1

FOREIGN PATENT DOCUMENTS

JP       2000-63433   *   2/2000

OTHER PUBLICATIONS

Chemical Abstract (132:187644) for JP 2000-63433 (Iwasa et al).*
Machine-assisted English translation for JP 2000-63433 (Iwasa et al) provided by JPO.*
Full, formal English translation of JP 2000-63433 (Iwasa et al), provided by USPTO.*

* cited by examiner

*Primary Examiner*—Sin Lee
(74) *Attorney, Agent, or Firm*—Schmeiser, Olsen & Watts; Steven Capella

(57) ABSTRACT

A negative photoresist composition and a method of patterning a substrate through use of the negative photoresist composition. The composition includes: a radiation sensitive acid generator; a multihydroxy-containing additive; and a resist polymer comprising a first repeating unit from a first monomer. The resist polymer may also comprise a second repeating unit from a second monomer, wherein the second monomer has an aqueous base soluble moiety. The multihydroxy-containing additive has the structure $Q\text{-}(OH)_m$, where Q may include at least one alicyclic group and m may be any integer between 2 and 6. The acid generator is adapted to generate an acid upon exposure to radiation. The resist polymer is adapted to chemically react with the additive in the presence of the acid to generate a product that is insoluble in a developer solution.

17 Claims, 3 Drawing Sheets

NEGATIVE PHOTORESIST AND METHOD OF USING THEREOF

BACKGROUND OF THE INVENTION

1. Technical Field

The present invention relates generally to the fabrication of semiconductor devices and, more particularly, to a negative photoresist composition having a crosslinking component characterized by a multihydroxy functionality.

2. Related Art

Photolithography is a process of transferring a pattern of geometric shapes on a mask to a substrate such as a silicon wafer. The mask may be a glass plate containing a pattern (e.g., a chromium pattern) of transparent and opaque regions to define the geometrical shapes. Given such a substrate, a layer of photoresist is applied to an exterior surface of the substrate such as by spin coating or the like. There are two types of photoresist: positive photoresist and negative photoresist. Positive resists are insoluble in a developer solution, whereas negative resists are soluble in a developer solution.

For positive resists, the resist is exposed with ultraviolet (UV) light. The UV light is propagated through the mask and onto the substrate, wherever the underlying material is to be removed. In the positive resists, exposure to the UV light changes the chemical structure of the resist so that it becomes soluble in a developer solution. The exposed resist is then selectively washed away by the developer solution, leaving isolated regions of the unexposed resist. The mask, therefore, contains an exact copy of the geometric pattern which is to remain on the substrate.

Negative resists behave in the opposite manner. As is known in the art, exposure to the UV light initiates a cross-linking reaction which causes the negative resist to become crosslinked with a consequent significant increase in molecular weight of the reaction product as compared with the molecular weight of the unexposed negative resist. The increase in molecular weight results in the reaction product being insoluble in the developer solution. The cross-linking reaction may be acid catalyzed, and the negative resist may accordingly include an acid generator that generates acid upon exposure to the UV light. Thus, the negative resist remains on the surface of the substrate wherever it is exposed, and the developer solution removes only the unexposed portions. Masks used for negative photoresists, therefore, contain the inverse of the geometric pattern to be transferred.

Unfortunately, the exposed negative photoresist may become subject to swelling and/or microbridging in the developer solution because of its high molecular weight. Therefore, there is a need for a negative photoresist that is not subject to swelling and/or microbridging when placed in a developer solution after being exposed to radiation.

SUMMARY OF THE INVENTION

A first embodiment of the present invention is a negative photoresist composition, comprising:

(a) a radiation sensitive acid generator;

(b) a multihydroxy-containing additive having the structure:

Q-(OH)$_m$, wherein Q is one of an aliphatic group with 2 to 60 carbons, an aromatic group with 6 to 60 carbons, a semi- or perfluorinated aliphatic group with 2 to 60 carbons, a semi- or perfluorinated aromatic group with 6 to 60 carbons; and wherein m is an integer from 2 to 6; and (c) a resist polymer comprising a first repeating unit from a first monomer, wherein the first monomer has the structure:

(2)

wherein M is a polymerizable backbone moiety, wherein Z is a linking moiety comprising one of —C(O)O—, —C(O)—, —OC(O)—, —O—C(O)—C(O)—O—, wherein Y is one of an alkylene group, an arylene, a semi- or perfluorinated alkylene group, and a semi- or perfluorinated arylene group, wherein p and q are independently 0 or 1, wherein R$_1$, and R$_2$ independently comprise one of hydrogen and a straight or branched alkyl group with 1 to 6 carbons, wherein the resist polymer is soluble in an aqueous alkaline developer solution, wherein the acid generator is adapted to generate an acid upon exposure to imaging radiation characterized by a wavelength, and wherein the resist polymer is adapted to chemically react with the additive in the presence of the acid to generate a product that is insoluble in the developer solution.

A second embodiment of the present invention is a method of patterning a substrate, said method comprising the steps of:

(A) applying a negative photoresist composition to the substrate to form a resist layer on a material layer of the substrate and in direct mechanical contact with the material layer, said composition comprising:

(a) a radiation sensitive acid generator, (b) a multihydroxy-containing additive having the structure:

Q-(OH)$_m$, wherein Q is one of an aliphatic group with 2 to 60 carbons, an aromatic group with 6 to 60 carbons, a semi- or perfluorinated aliphatic group with 2 to 60 carbons, a semi- or perfluorinated aromatic group with 6 to 60 carbons; and wherein m is an integer from 2 to 6; and (c) a resist polymer comprising a first repeating unit from a first monomer, wherein the first monomer has the structure:

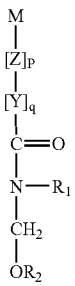

(2)

wherein M is a polymerizable backbone moiety,
wherein Z is a linking moiety comprising one of —C(O)O—, —C(O)—, —OC(O)—, —O—C(O)—C(O)—O—,
wherein Y is one of an alkylene group, an arylene, a semi- or perfluorinated alkylene group, and a semi- or perfluorinated arylene group,
wherein p and q are independently 0 or 1,
wherein $R_1$, and $R_2$ independently comprise one of hydrogen and a straight or branched alkyl group with 1 to 6 carbons,
wherein the resist polymer is soluble in an aqueous alkaline developer solution, (B) selectively exposing a first portion of the resist layer to imaging radiation characterized by a wavelength such that a second portion of the resist layer is not exposed to the radiation, wherein the first and second portions of the resist layer form a pattern in the resist layer, wherein the radiation causes the acid generator to generate acid in the first portion of the resist layer, wherein the acid facilitates a chemical reaction between the resist polymer and the additive in the first portion of the resist layer such to generate a reaction product in the first portion of the resist layer, and wherein the reaction product is insoluble in the developer solution; and (C) developing away the second portion of the resist layer by contacting the resist layer with the developer solution such that the second portion of the resist layer is replaced by voids in the resist layer.

The present invention advantageously provides negative photoresists that are not subject to swelling and/or microbridging when placed in a developer solution after being exposed to radiation, nor does their use give rise to unwanted effects such as scumming, and residue, in the exposed region.

DETAILED DESCRIPTION OF THE INVENTION

Figure 1:
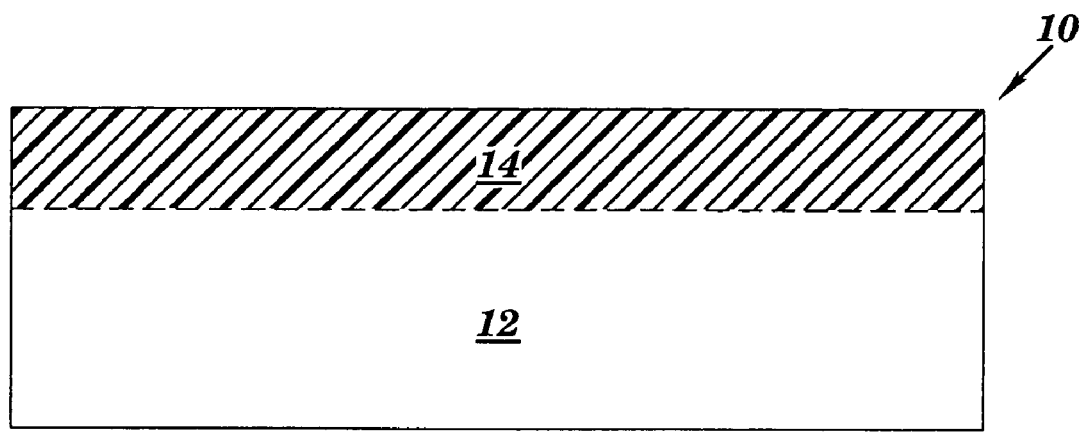
FIGS. 1–6 illustrate the use of photolithography with a negative photoresist to pattern a substrate, in accordance with embodiments of the present invention.

Photolithography using the negative photoresist compositions of the present invention and using imaging radiation characterized by a wavelength of 193 nm or less (e.g., 157 nm) is generally capable of providing good spatial resolution in lithographic patterns. For example, the negative photoresist compositions of the present invention may provide lithographic patterns having spatial resolution for line/space pairs of at least 140 nm (i.e., 0.14 μm). The present invention further encompasses a method of patterning a substrate (e.g., a semiconductor wafer) though use of said negative photoresist compositions.

The negative photoresist compositions of the present invention generally comprise:

(a) a radiation sensitive acid generator;
(b) a multihydroxy-containing additive having the structure $$Q\text{-}(OH)_m \quad (1)$$

wherein Q is one of an aliphatic group with 2 to 60 carbons, an aromatic group with 6 to 60 carbons, a semi- or perfluorinated aliphatic group with 2 to 60 carbons, a semi- or perfluorinated aromatic group with 6 to 60 carbons; and wherein m is an integer from 2 to 6; and (c) a resist polymer comprising a first repeating unit from a first monomer, wherein the first monomer has the structure:

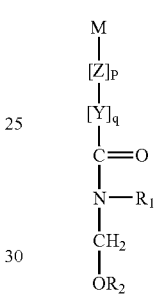

(2)

wherein M is a polymerizable backbone moiety,
wherein Z is a linking moiety comprising one of —C(O)O—, —C(O)—, —OC(O)—, —O—C(O)—C(O)—O—,
wherein Y is one of an alkylene group, an arylene, a semi- or perfluorinated alkylene group, and a semi- or perfluorinated arylene group,
wherein p and q are independently 0 or 1,
wherein $R_1$, and $R_2$ independently comprise one of hydrogen and a straight or branched alkyl group with 1 to 6 carbons,
wherein the resist polymer is soluble in an aqueous alkaline developer solution,
wherein the acid generator is adapted to generate an acid upon exposure to imaging radiation characterized by a wavelength, and
wherein the resist polymer is adapted to chemically react with the additive in the presence of the acid to generate a product that is insoluble in the developer solution.

The acid generator in the negative resist composition may include any radiation-sensitive acid generating structure, or a combination of such radiation-sensitive acid generating structures, that absorbs a significant portion of the imaging radiation at its characteristic wavelength (e.g., at a wavelength of 193 nm or below such as at 157 nm). Thus, the negative photoresist of the present invention is not limited to the use of any specific acid generator or combination of acid generators subject to the aforementioned radiation absorptivity constraint.

In various exemplary embodiments, radiation sensitive acid generators, also known as photoacid generators, may be used in the photoresist composition of the invention. These photoacid generators are compounds that generate an acid upon exposure to radiation. In various exemplary embodiments, any suitable photoacid generating agent may be used, so long as a mixture of the aforementioned photoresist composition of the present invention and the selected photoacid generator dissolve sufficiently in an organic solvent and the resulting solution thereof may form a uniform film by a film-forming process, such as spin coating or the like. As is well known to those skilled in the art after reading the present application, the following illustrative classes of photoacid generators may be employed in various exemplary embodiments of the present invention: onium salts, succinimide derivatives, diazo compounds, nitrobenzyl compounds, and the like. To minimize acid diffusion for high resolution capability, the photoacid generators may be such that they generate bulky acids upon exposure to radiation. Such bulky acids may include at least 4 carbon atoms.

A preferred photoacid generator that may be employed in the present invention is an onium salt, such as an iodonium salt or a sulfonium salt, and/or a succinimide derivative. In various exemplary embodiments of the present invention, examples of the preferred photoacid generator structures for the present invention include, inter alia, at least one of: 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl)tetrahydrothiophenium perfluorooctanesulfonate, triphenyl sulfonium perfluorooctanesulfonate, t-butylphenyl diphenyl sulfonium perfluorooctanesulfonate, di(t-butylphenyl)iodonium perfluorobutane sulfonate, di(t-butylphenyl)iodonium perfluorohexane sulfonate, di(t-butylphenyl)iodonium perfluoroethylcyclohexane sulfonate, di(t-buylphenyl)iodonium camphoresulfonate, and perfluorobutylsulfonyloxybicylo[2.2.1]-hept-5-ene-2,3-dicarboximide. Any of the preceding photoacid generators may be used singly or in a mixture of two or more. The specific photoacid generator selected will depend on the irradiation being used for patterning the photoresist. Photoacid generators are currently available for a variety of different wavelengths of light from the visible range to the X-ray range; thus, imaging of the photoresist can be performed using deep-UV, extreme-UV, e-beam, laser, or any other selected irradiation source that is deemed useful.

The negative photoresist compositions of the present invention make use of a crosslinking reaction between an alkali-soluble resist polymer containing an alkoxymethylamido group and a multi-hydroxy crosslinking agent. The following structures (I to XVIII) are non-limiting examples of the multihydroxy-containing additive (1) which may be used in the negative photoresist composition of the present invention: (Note, the wavy bonds in structure V designate that V may be either the exo or endo isomer. Note also that a substituent such as a hydroxyl group bonded between two carbons of norbornane in structure VI designate the hydroxyl groups may be bonded to the 2, 5 or 2, 6 carbon atoms of the norbornane.)

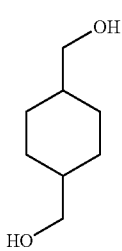

(I)

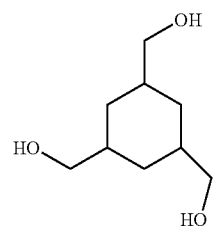

(II)

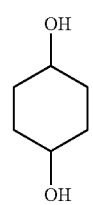

(III)

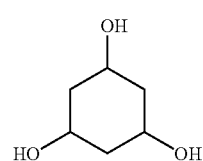

(IV)

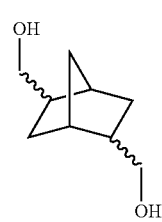

(V)

(VI)

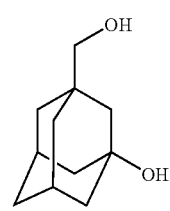

(VII)

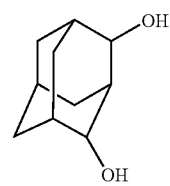

(VIII)

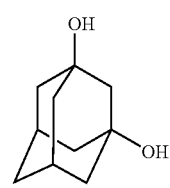

(IX)

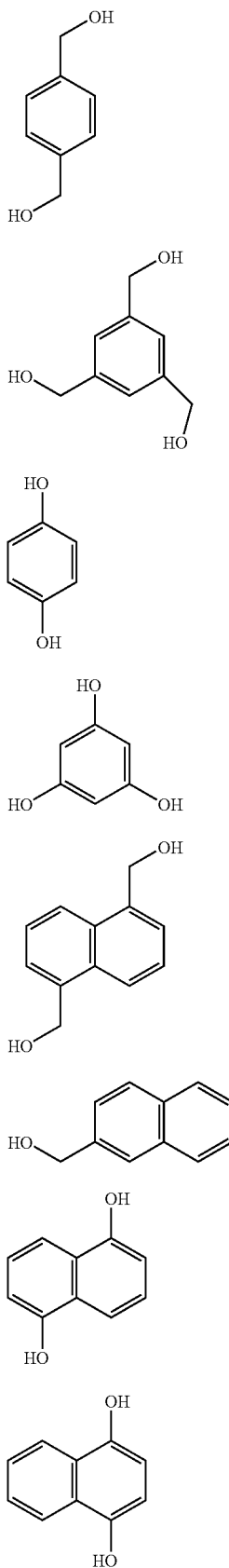

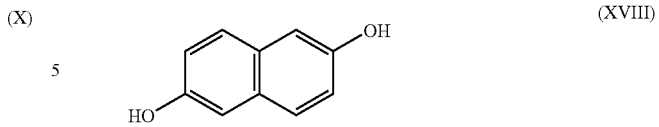

The resist polymer of the present invention may comprise a first repeating unit from various first monomers in accordance with the structure (2), supra, wherein coupling the first repeating units from one of said various first monomers may form a backbone having any sequential order of the repeating units along said backbone. Thus, the resist polymer may include repeating units from only a single specific first monomer having the structure (2), supra, or may alternatively include repeating units from two or more different first monomers having the structure (2), infra, in any sequential order along the backbone.

The following structures (XIX to XXXVII) are non-limiting examples of first monomers that may be represented by the general structure (2):

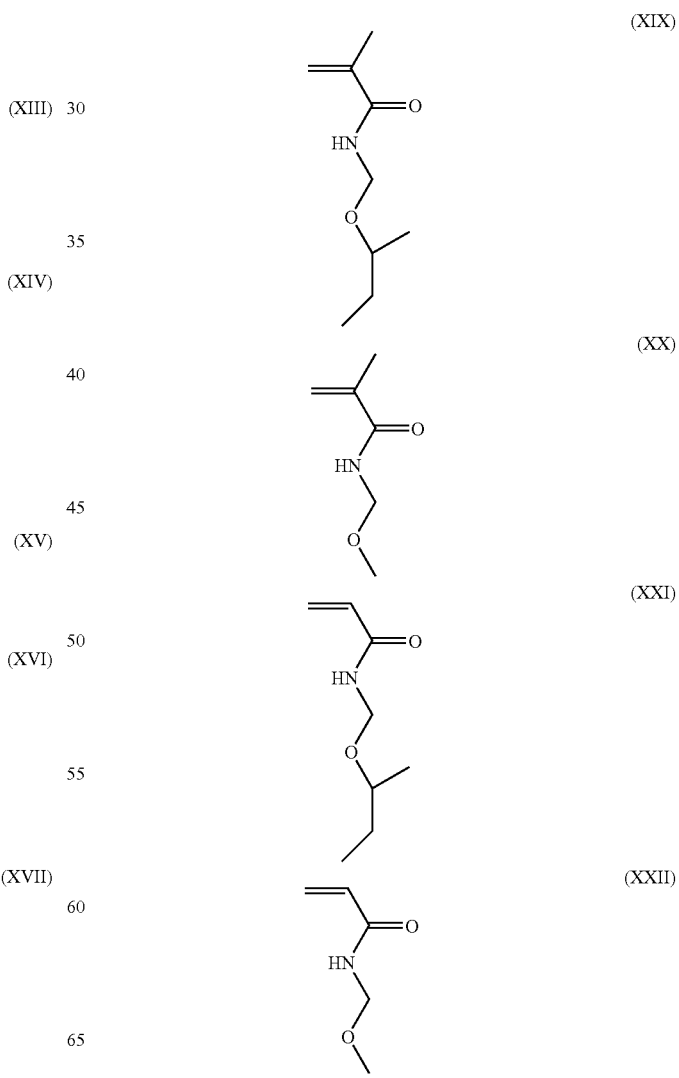

-continued

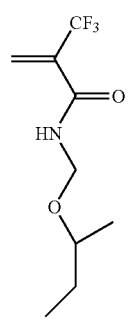
(XXIII)

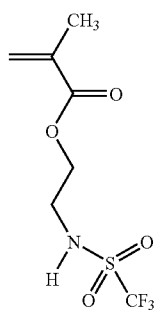
(XXIV)

(XXV)

(XXVI)

The resist polymer may further comprise a repeating unit from a second monomer, wherein the second monomer has an aqueous base soluble moiety. The second monomer may comprise an acidic functionality such as a fluorosulfonamide, a carboxylic acid, or a fluoroalcohol to provide the associated second monomer with said aqueous base soluble moiety.

The following structures (XXVII to XXXXVII) are non-limiting examples of second monomers that may be coupled, for example, by polymerization to form the resist polymer:

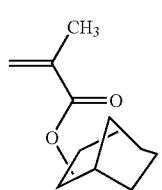
(XXVII)

(XXVIII)

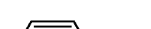
(XXIX)

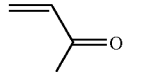

(XXX)

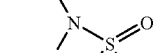
(XXXI)

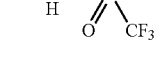

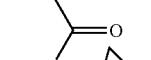

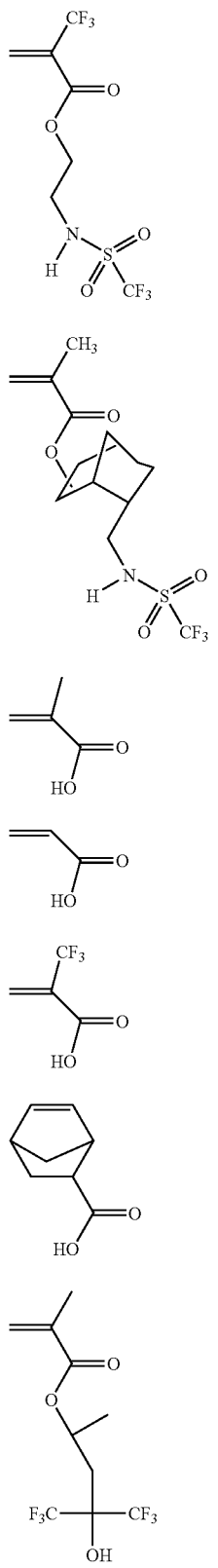
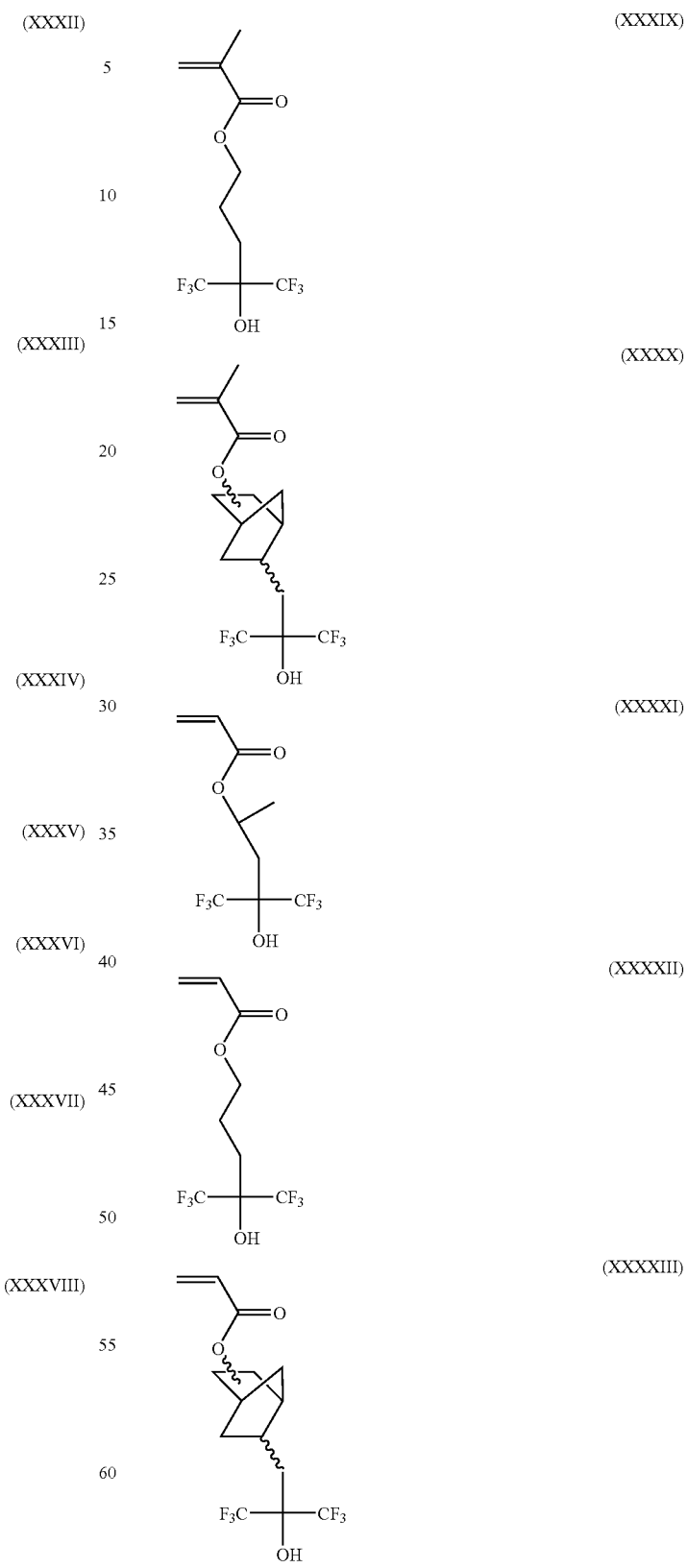

-continued

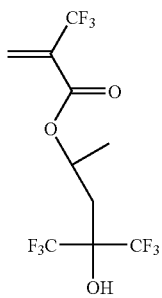

(XXXXIV)

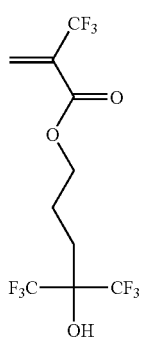

(XXXXV)

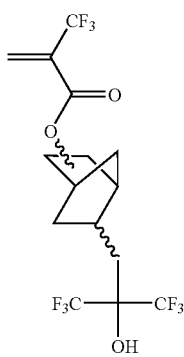

(XXXXVI)

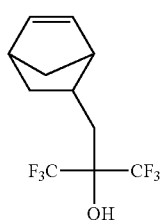

(XXXXVII)

Note that in the preceding structures XXXX, XXXXIII, and XXXXVI, the bond from oxygen (O) to a position between two carbons of norbornane signifies that the O is bonded to either of the two carbons of norbornane and that the isomers may be either endo or exo.

The backbone units of the resist polymer may be formed from coupling, such as, by polymerization, any "M" units of the first monomer (2), or the first and second monomers. The choice of "M" units on the first monomers (2) may be made on the basis of ease of polymerization. For example, M may comprise, inter alia, an acrylic or a cyclic olefinic group, wherein one of the olefinic carbon atoms of the acrylic or cyclic olefinic group may be bonded to Z in the first monomer (2). When M is acrylic, it may be represented by structure (3) as follows:

(3)

wherein $R_3$ represents one of hydrogen, an alkyl group of 1 to 20 carbons, a semi- or perfluorinated alkyl group of 1 to 20 carbons, and CN. When M is a cyclic olefinic group it may have the following structure (4):

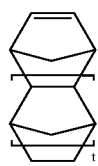

(4)

wherein t is an integer from 0 to 3.

The negative photoresist compositions of the present invention may make use of a crosslinking reaction, such as depicted in reaction (1) infra, between an alkali-soluble resist polymer having an alkoxymethylamido group and the hydroxy groups of a multi-hydroxy crosslinking agent. There are many multihydroxy-containing compounds commercially available. The crosslinking efficiency, diffusion of crosslinker, etc., hereinafter "crosslinking chemistry," may be controlled by choosing crosslinkers having a desired number of crosslinking sites and/or desired molecular size and shape.

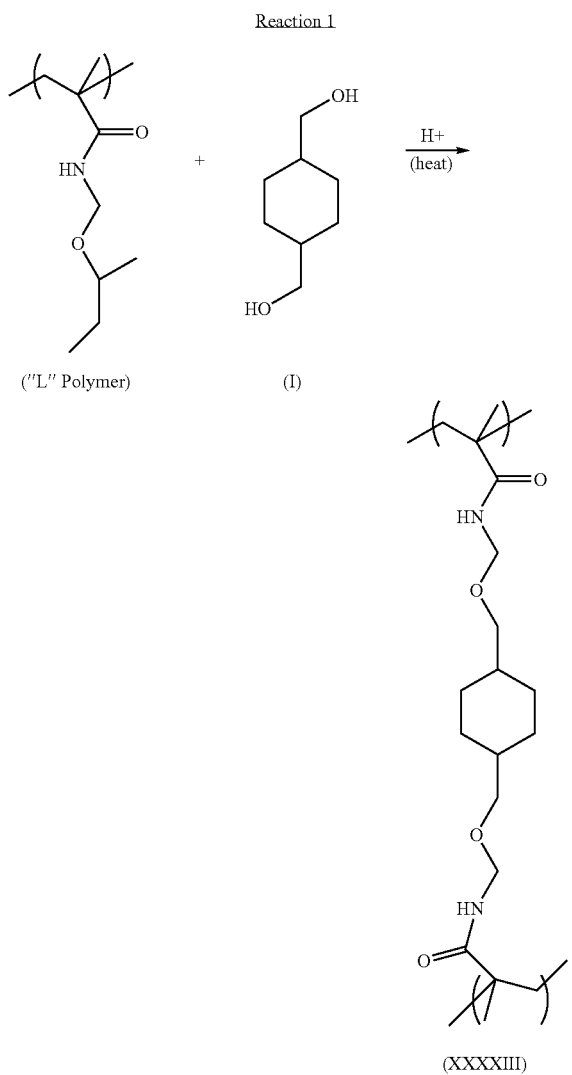

Referring to reaction (1), supra, the crosslinking reaction may be acid catalyzed. The acid is generated by an acid generator upon exposure of the negative photoresist composition to an imaging radiation characterized by a wavelength, such as 193 nm or less (e.g. 157 nm). Prior to the exposure of the photoresist to the imaging radiation, the resist polymer is soluble in an aqueous alkaline developer solution. The generated acid catalyzes a chemical reaction between the resist polymer and the multihydroxy-containing additive (I) to generate a reaction product that is insoluble in the developer solution. The negative photoresists of the present invention are not subject to swelling and/or microbridging when placed in a developer solution, such as tetramethylammonium hydroxide (TMAH), after being exposed to radiation. They could also help prevent unwanted effects such as scumming which may result from diffusion of the activated crosslinkers into the non-exposed regions of the negative photoresist.

The negative photoresist compositions of the present invention may further comprise a solvent, and other performance enhancing additives; e.g., a quencher.

Solvents well known to those skilled in the art may be employed in the photoresist composition of various exemplary embodiments of the present invention. Such solvents may be used to dissolve the resist polymer, the additive, and other components of the photoresist composition. Illustrative examples of such solvents may include, but are not limited to: ethers, glycol ethers, aromatic hydrocarbons, ketones, esters and the like. Preferred solvents may include propylene glycol monomethyl ether acetate, ethyl lactate, γ-butyrolactone, and cyclohexanone. Any of these solvents may be used singly or in a mixture of two or more.

The quencher that may be used in the photoresist composition of the invention may comprise a weak base that scavenges trace acids, while not having an excessive impact on the performance of the negative photoresist. Illustrative examples of such quenchers may include aromatic or aliphatic amines, such as 2-phenylbenzimidazole, tetraalkyl ammonium hydroxides, such as tetrabutyl ammonium hydroxide (TBAH).

In some embodiments for the negative photoresist composition of the present invention: the weight of the polymer is about 1% to about 30% of the weight of the composition; the weight of the solvent is about 70% to about 99% of the weight of the composition; the weight of the mutlihydroxy-containing additive is about 1% to about 30% of the weight of the polymer; and the weight of the acid generator is about 0.5% to about 20% of the weight of the polymer. The preceding weight percents of the multihydroxy-containing additive and the acid generator are relevant if the solvent is present in the composition and are also relevant if the solvent is not present in the composition.

In some embodiments for the negative photoresist composition of the present invention: the weight of the polymer is about 5% to about 15% of the weight of the composition; the weight of the solvent is about 85% to about 95% of the weight of the composition; the weight of the multihydroxy-containing additive is about 1% to about 15% of the weight of the polymer; and the weight of the acid generator is about 0.5% to about 10% of the weight of the polymer. The preceding weight percents of the hydroxy-containing additive and the acid generator are relevant if the solvent is present in the composition and are also relevant if the solvent is not present in the composition.

The negative photoresist composition may further comprise a quencher, wherein the weight of the quencher is about 0.1% to about 1.0 wt. % of the weight of the polymer.

If the resist polymer is from both first monomers having the structure (2) and second monomers having an aqueous base moiety, then relative molar concentration of the first monomer and the second monomer depends on the specific choices of the first monomer and the second monomer. Due to the variability in extent to which the first monomer and the second monomer are soluble in the developer solution and in consideration of specific first and second monomers which may be used, in some embodiments a ratio $R_M$ of the molar concentration of the second monomer to the molar concentration of the first monomer (for deriving the resist polymer) may be in a range of about 0.1 to about 10. In other embodiments, $R_M$ may be in a range of about 0.5 to about 5.

The present invention is not limited to any specific method of synthesizing the resist polymer, and any method of synthesis known to a person of ordinary skill in the art may be utilized. For example, the resist polymer may be formed by free radical polymerization. Examples of other suitable techniques for cyclic olefin polymers and other polymers are disclosed in U.S. Pat. Nos. 5,468,819, 5,705, 503, 5,843,624 and 6,048,664, the disclosures of which are incorporated herein by reference.

The negative resist compositions of the invention can be prepared by combining the resist polymer "Poly(XIX-co-XXXVIII)," as in Example 1, infra, the multihydroxy-containing additive (I), and the radiation sensitive acid generator, and any other desired ingredients using conventional methods. The negative resist composition to be used in lithographic processes may have a significant amount of solvent.

The resist compositions of the invention are especially useful for lithographic processes used in the manufacture of integrated circuits on semiconductor substrates. The negative resist compositions are especially useful for lithographic processes using 193 nm or less (e.g., 157 nm) ultraviolet (UV) radiation. Where use of other radiation (e.g. x-ray, or e-beam) is desired, the compositions of the invention can be adjusted (if necessary) by the addition of an appropriate dye or sensitizer to the composition. The use of the resist compositions of the present invention in lithography for patterning substrates (e.g., semiconductor substrates) is described next.

Lithographic applications generally involve transfer of a pattern to a layer of material on the substrate (e.g., semiconductor substrate, ceramic substrate, organic substrate, etc.). The material layer of the substrate may be a semiconductor layer (e.g., silicon, germanium, etc.), a conductor layer (e.g., copper), a dielectric layer (e.g., silicon dioxide), or other material layer depending on the stage of the manufacture process and the desired material set for the end product. In some applications, an antireflective coating (ARC) is applied over the material layer before application of the resist layer. The ARC layer may be any conventional ARC which is compatible with the negative photoresists of the present invention.

The solvent-containing negative photoresist composition may be applied to the desired substrate using, inter alia, spin coating or other technique. The substrate with the resist coating may be heated (i.e., pre-exposure baked) to remove the solvent and improve the coherence of the resist layer. The thickness of the applied layer may be thin, subject to the thickness being substantially uniform and the resist layer being of sufficient thickness to withstand subsequent processing (e.g., reactive ion etching) to transfer the lithographic pattern to the underlying substrate material layer. The pre-exposure bake step may be preferably conducted for about 10 seconds to 15 minutes, more preferably about 15 seconds to one minute.

After solvent removal, the resist layer is then patternwise-exposed to the desired radiation (e.g. 193 nm or 157 nm ultraviolet radiation). Where scanning particle beams such as electron beam are used, patternwise exposure may be achieved by scanning the beam across the substrate and selectively applying the beam in the desired pattern. Where wavelike radiation forms such as 193 nm or 157 nm ultraviolet radiation are used, the patternwise exposure may be conducted through a mask which is placed over the resist layer. The mask is patterned such that first portions of the mask are transparent to the radiation and second portions of the mask are opaque to the radiation. Thus the radiation-exposed photoresist coating on the substrate has an exposure pattern that reflects the patterning of the mask. For 193 nm UV radiation, the total exposure energy is preferably about 100 millijoules/$cm^2$ or less, and more preferably about 50 millijoules/$cm^2$ or less (e.g. 15–30 millijoules/ $cm^2$).

After the desired patternwise exposure, the resist layer may be baked to further complete the acid-catalyzed reaction and to enhance the contrast of the exposed pattern. The post-exposure bake may be conducted at about 100–175 (C, and more preferably at about 100–130 (C. The post-exposure bake may be conducted for about 15 seconds to 5 minutes.

After post-exposure bake, the resist structure with the desired pattern is obtained by contacting the negative resist layer with the aqueous alkaline developer solution which selectively dissolves the areas of the negative resist which were not exposed to radiation. The resist compositions of the present invention can be developed for use with conventional 0.26N aqueous alkaline solutions. The resist compositions of the invention can also be developed using 0.14N or 0.21N or other aqueous alkaline solutions. The resulting resist structure on the substrate may be dried to remove any remaining developer. The resist compositions of the present invention are generally characterized in that the product resist structures have high etch resistance. In some instances, it may be possible to further enhance the etch resistance of the resist structure by using a post-silylation technique using methods known in the art.

The pattern from the resist structure may then be transferred to the material (e.g., dielectric, conductor, or semiconductor) of the underlying substrate. The transfer may be achieved by reactive ion etching or some other etching technique (e.g., chemical etching). In the context of reactive ion etching, the etch resistance of the resist layer may be important. Thus, the compositions of the invention and resulting resist structures can be used to create patterned material layer structures such as metal wiring lines, holes for contacts or vias, insulation sections (e.g., damascene trenches or shallow trench isolation), trenches for capacitor structures, etc., as might be used in the design of integrated circuit devices.

The processes for making these (ceramic, conductor, or semiconductor) features generally involve providing a material layer or section of the substrate to be patterned, applying a layer of resist over the material layer or section, patternwise exposing the resist to radiation, developing the pattern by contacting the exposed resist with a solvent, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. Examples of such processes are disclosed in U.S. Pat. Nos. 4,855,017; 5,362,663; 5,429,710; 5,562,801; 5,618,751; 5,744,376; 5,801,094; and 5,821,169, the disclosures of which patents are incorporated herein by reference. Other examples of pattern transfer processes are described in Chapters 12 and 13 of "Semiconductor Lithography, Principles, Practices, and Materials" by Wayne Moreau, Plenum Press, (1988). It should be understood that the invention is not limited to any specific lithography technique or device structure.

FIGS. 1–6 illustrate the use of photolithography with a negative photoresist to pattern a substrate, in accordance with embodiments of the present invention.

FIG. 1 depicts a substrate 10 comprising a material layer 14 (to be patterned) and a remaining layer 12.

Figure 2:
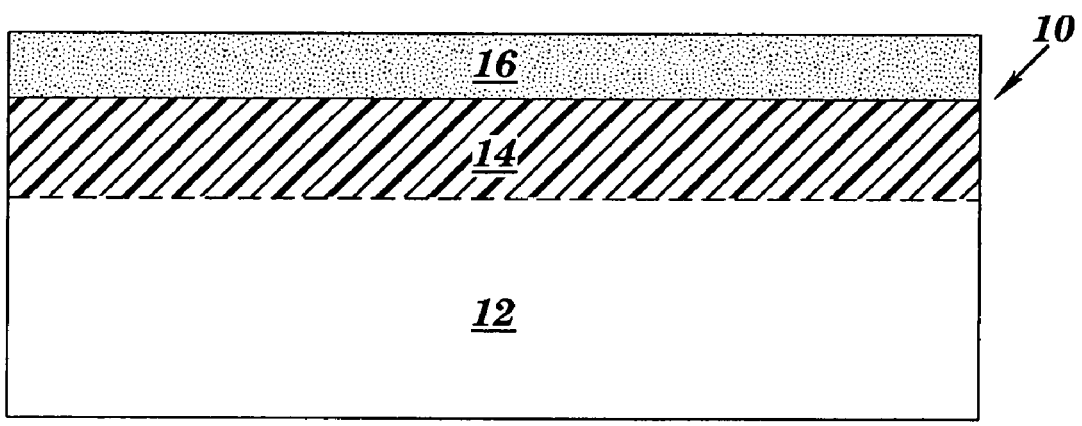

FIG. 2 depicts FIG. 1 after a photoresist layer 16 has been formed on the material layer 14. The photoresist layer 16 includes the negative photoresist composition of the present invention, comprising an acid generator, the hydroxy-containing additive (1), and the resist polymer "L". The negative photoresist composition is soluble in an aqueous base developer solution prior to being exposed to the imaging radiation discussed infra in conjunction with FIG. 3.

Figure 3:
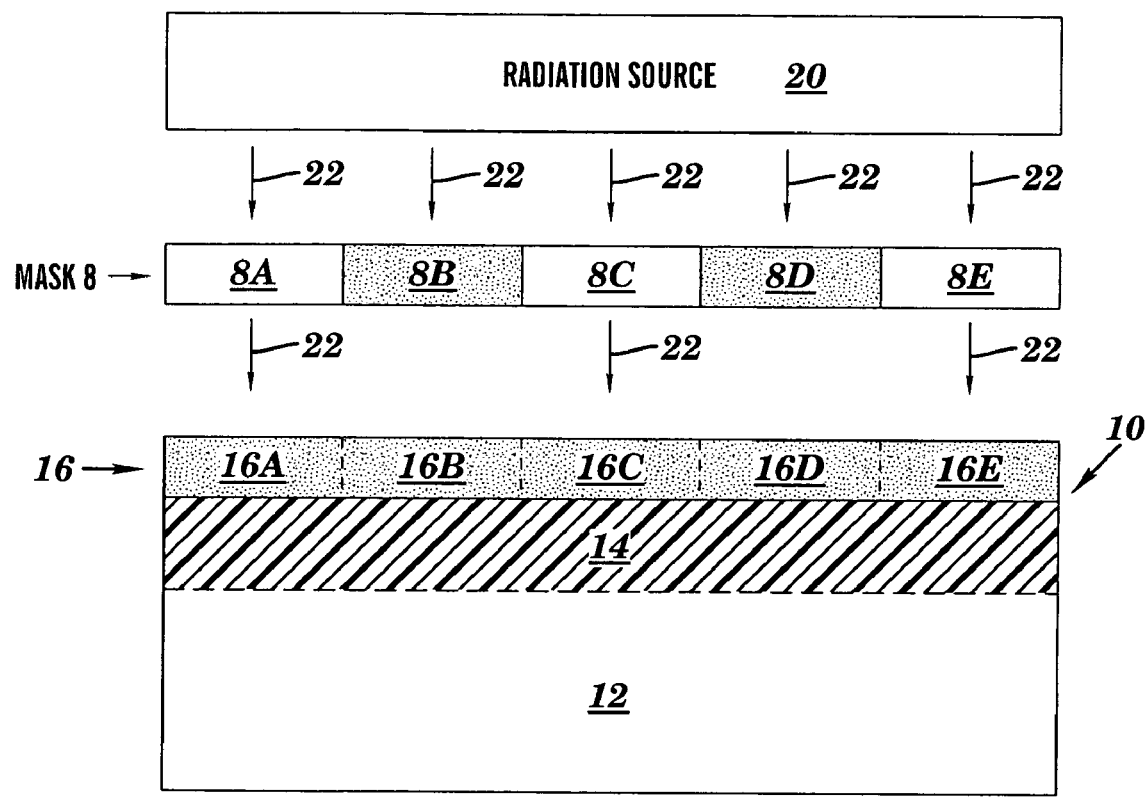

FIG. 3 depicts FIG. 2 with a radiation source 20 emitting imaging radiation 22 through transparent portions 8A, 8C, and 8E of a mask 8. The radiation 22 is characterized by a wavelength such as, inter alia, 193 nm or less (e.g., 157 nm). The radiation 22 does not pass through opaque portions 8B and 8D of the mask 8. The radiation 22 transmitted through the transparent portions 8A, 8C, and 8E of the mask 8 strikes those portions 16A, 16C, and 16E of the photoresist layer 16 which are directly beneath said transparent portions of the mask 8. The radiation 22 causes the acid generator in portions 16A, 16C, and 16E of the photoresist layer 16 to generate acid, which in turn causes the hydroxy-containing additive (1) to chemically react with the resist polymer "L" to generate a reaction product that is insoluble in the developer solution. Thus after the photoexposure to the radiation 22, the exposed portions 16A, 16C, and 16E of the photoresist layer 16 are insoluble in the developer solution, whereas the unexposed portions 16B and 16D of the photoresist layer 16 are soluble in the developer solution.

Figure 4:
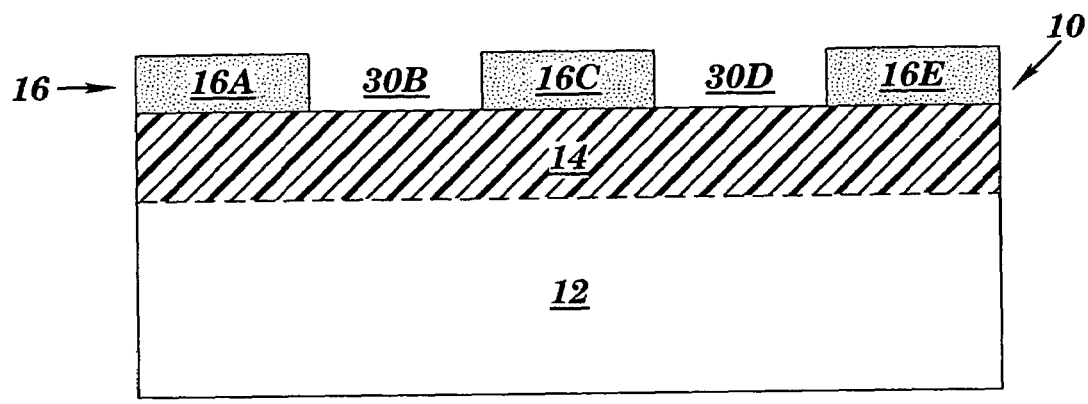

FIG. 4 depicts FIG. 3 after the developer solution been applied to the photoresist layer 16 and has thus developed away the unexposed portions 16B and 16D of the photoresist layer 16 to generate voids 30B and 30D, respectively, in the photoresist layer 16.

Figure 5:
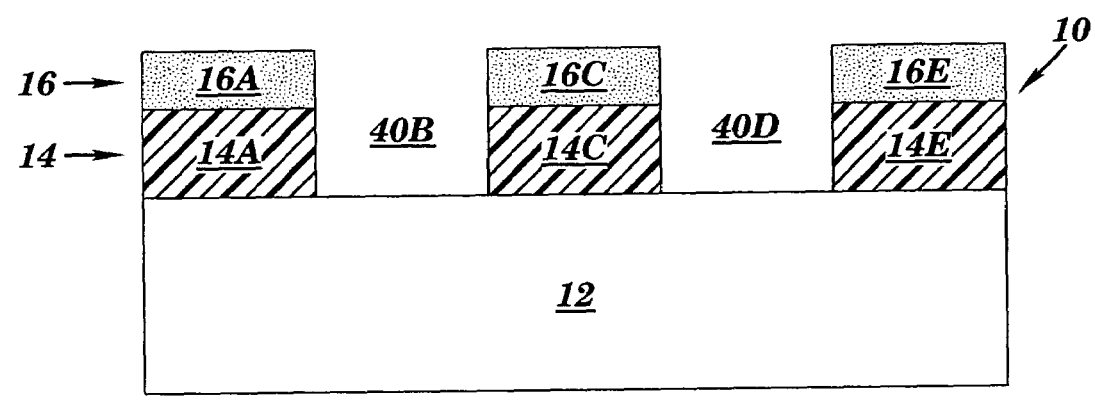

FIG. 5 depicts FIG. 4 after material layer 14 has been etched, such as by reactive ion etching or chemical etching, through the voids 30B and 30D to form blind vias 40B and 40D, respectively, in the material layer 14. The unetched portions 14A, 14C, and 14E of the material layer 14, together with the blind vias 40B and 40D in the material layer 14, form a pattern in the material layer 14. Said pattern in the material layer 14 reflects the pattern of transparent and opaque portions of the mask 8 of FIG. 3.

Figure 6:
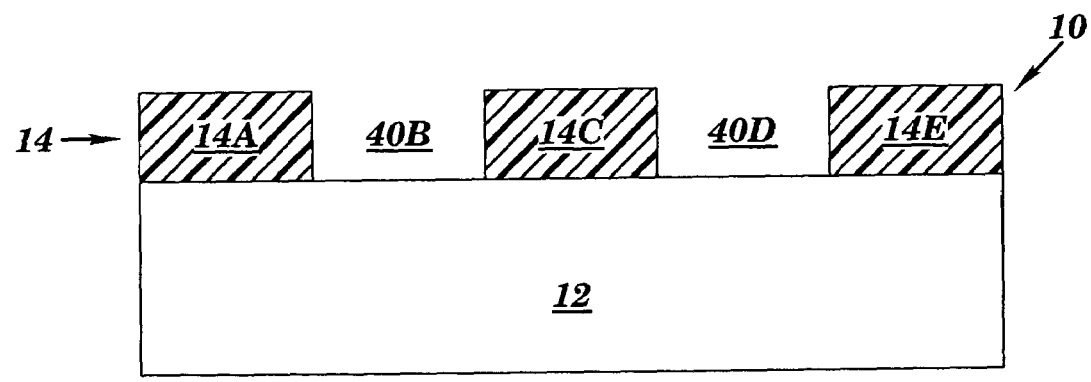

FIG. 6 depicts FIG. 5 after the photoresist layer 16 has been removed.

Example 1, infra, describes synthesis of a resist polymer, "Poly(XIX-co-XXXVIII)," containing a first repeating unit from a first monomer (XIX) and a second repeating unit from a second monomer (XXXVIII). In Example 1, the ratio $R_M$ of the molar concentration of the second monomer to the molar concentration of the first monomer is 1.5.

EXAMPLE 1

Synthesis of Poly(XIX-co-XXXVIII)

0.2 g (0.0012 mol) of 2,2'-azobisisobutyronitrile (AIBN) was added to a solution of 2.05 g (0.012 mol) of N-(isobutoxymethyl)methacrylamide (XIX), 5.29 g (0.018 mol) of 1,1,1-trifluoro-2-trifluoromethyl-2-hydroxy-4-pentyl methacrylate (XXXVIII), and 0.081 g (0.0004 mol) dodecanethiol in 22 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 400 mL of hexanes with rigorous stirring. The resulting white solid was collected by filtration, washed with several portions of hexanes, and dried under vacuum at 60° C. for 20 hr.

EXAMPLE 2

For the purpose of evaluative lithographic experiments, a photoresist formulation containing Poly(XIX-co-XXXVIII) (Example 1) was prepared by combining the materials set forth below, expressed in part by weight.

| | |
|---|---|
| Propylene glycol monomethyl ether acetate | 89.73 |
| 1,4-Cyclohexanedimethanol | 0.64 |
| Poly(XIX-co-XXXVIII) | 9.13 |
| 4-(1-Butoxynaphthyl)tetrahydrothiophenium perfluorooctanesulfonate | 0.46 |
| 2-Phenylbenzimidazole | 0.038 |

The prepared photoresist formulation was spin-coated for 30 seconds onto an antireflective material (AR40, Shipley Company) layer applied on silicon wafers. The photoresist layer was soft-baked at 120° C. for 60 seconds on a vacuum hot plate to produce a film thickness of about 0.24 μm. The wafers were then exposed to 193 nm radiation (ASML scanner, 0.75 NA). The exposure pattern was an array of lines and spaces of varying dimensions down to 0.09 μm. The exposed wafers were post-exposure baked on a vacuum hot plate at 120° C. for 90 seconds. The wafers were then puddle developed using 0.263 N TMAH developer for 60 seconds. The resulting patterns of the photoresist imaging layer were then examined by scanning electron microscopy (SEM). Patterns of line/space pairs of 150 nm, i.e., 0.15 μm, and above were well resolved.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A negative photoresist composition, comprising:
   (a) a radiation sensitive acid generator;
   (b) a multihydroxy-containing additive having the structure:

$$Q\text{-}(OH)_m, \qquad (1)$$

wherein Q is one of an aliphatic group with 2 to 60 carbons, an aromatic group with 6 to 60 carbons, a semi- or perfluorinated aliphatic group with 2 to 60 carbons, a semi- or perfluorinated aromatic group with 6 to 60 carbons; and wherein m is an integer from 2 to 6; and
   (c) a resist polymer comprising a first repeating unit from a first monomer, wherein the first monomer has the structure;

(2)

wherein M is a polymerizable backbone moiety,
wherein Z is a linking moiety comprising one of
—C(O)O—, —C(O)—, —OC(O)—, —O—C(O)—C(O)—O—, wherein Y is one of an alkylene group, an arylene, a semi- or perfluorinated alkylene group, and a semi- or perfluorinated arylene group, wherein p and q are independently 0 or 1, wherein $R_1$, and $R_2$ independently comprise one of hydrogen and a straight or branched alkyl group with 1 to 6 carbons, wherein the resist polymer is soluble in an aqueous alkaline developer solution, wherein the acid generator is adapted to generate an acid upon exposure to imaging radiation characterized by a wavelength, wherein the resist polymer is adapted to chemically react with the additive in the presence of the acid to generate a product that is insoluble in the developer solution, wherein the resist polymer further comprises a second repeating unit from a second monomer, wherein the second monomer has an aqueous base soluble moiety, and wherein the second monomer comprises one of a fluorosulfonamide and a fluoroalcohol.

2. The composition of claim 1, wherein Q includes at least one cyclic structure.

3. The negative photoresist composition claim 1, wherein Q comprises at least one alicyclic structures.

4. The negative photoresist composition of claim 1, wherein the polymerizable backbone moiety, M, includes one of an acrylic structure and a cyclic olefinic structure, wherein the acrylic structure is:

wherein $R_3$ represents one of hydrogen, an alkyl group of 1 to 20 carbons, a semi- or perfluorinated alkyl group of 1 to 20 carbons, and CN, and wherein the cyclic olefinic structure is:

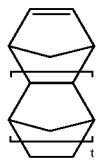

wherein t is an integer from 0 to 3.

5. The composition of claim 1, wherein the acid generator comprises at least one of 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphtyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl)iodonium perfluorobutane sulfonate, di(t-butylphenyl)iodonium perfluorohexane sulfonate, di(t-butylphenyl)iodonium perfluoroethylcyclohexane sulfonate, di(t-buylphenyl)iodonium camphoresulfonate, and perfluorobutylsulfonyloxybicylo[2.2.1]- hept-5-ene-2,3-dicarboximide.

6. The negative photoresist composition of claim 1, further comprising at least one of a solvent and a quencher.

7. The negative photoresist composition of claim 6, wherein the solvent comprises at least one of an ether, a glycol ether, an aromatic hydrocarbon, a ketone, an ester and combinations thereof.

8. The negative photoresist composition of claim 6, wherein the quencher is selected from the group consisting of aromatic amines, aliphatic amines and combinations thereof.

9. The composition of claim 6, wherein a weight percent of the polymer is from about 1 weight percent to about 30 weight percent of the weight of the composition; a weight percent of the solvent is from about 70% to about 99% of the weight of the composition; wherein a weight percent of the multihydroxy-containing additive is from about 1 weight percent to about 30 weight percent of the weight of the polymer; wherein a weight percent of the acid generator is from about 0.5 weight percent to about 20 weight percent of the weight of the polymer; and wherein a weight percent of die quencher is from about 0,1 weight percent to about 2.0 weight percent of the weight of the polymer.

10. The composition of claim 6, wherein a weight percent of the polymer is from about 5 weight percent to about 15 weight percent of the weight of the composition; a weight percent of the solvent is from about 85% to about 95% of the weight of the composition; wherein a weight percent of the multihydroxy-containing additive is from about 1 weight percent to about 15 weight percent of the weight of the polymer; wherein a weight percent of the acid generator is from about 0.5 weight percent to about 15 weight percent of the weight of the polymer; and wherein a weight percent of the quencher is from about 0.1 weight percent to about 1.0 weight percent of the weight of the polymer.

11. A method of patterning a substrate, said method comprising the steps of:

(A) applying a negative photoresist composition to the substrate to form a resist layer on a material layer of the substrate and in direct mechanical contact with the material layer, said composition comprising:

(a) a radiation sensitive acid generator, (b) a multihydroxy-containing additive having the structure:

$$Q\text{-}(OH)_m, \quad (1)$$

wherein Q is one of an aliphatic group with 2 to 60 carbons, an aromatic group with 6 to 60 carbons, a semi- or perfluorinated aliphatic group with 2 to 60 carbons, a semi- or perfluorinated aromatic group with 6 to 60 carbons; and wherein in is an integer from 2 to 6; and (c) a resist polymer comprising a first repeating unit from a first monomer, wherein the first monomer has the structure:

wherein M is a polymerizable backbone moiety,
wherein Z is a linking moiety comprising one of —C(O)O—, —C(O)—, —OC(O)—, —O—C(O)—C(O)—O—,
wherein Y is one of an alkylene group, an arylene, a semi- or perfluorinated alkylene group, and a semi- or perfluorinated arylene group,
wherein p and q are independently 0 or 1,
wherein $R_1$ and $R_2$ independently comprise one of hydrogen and a straight or branched alkyl group with 1 to 6 carbons,
wherein the resist polymer is soluble in an aqueous alkaline developer solution,
wherein the resist polymer further comprises a second repeating unit from a second monomer,
wherein the second monomer has an aqueous base soluble moiety, and
wherein the second monomer comprises one of a fluorosulfonamide and a fluoroalcohol, (B) selectively exposing a first portion of the resist layer to imaging radiation characterized by a wavelength such that a second portion of the resist layer is not exposed to the radiation, wherein the first and second portions of the resist layer form a pattern in the resist layer, wherein the radiation causes the acid generator to generate acid in the first portion of the resist layer, wherein the acid facilitates a chemical reaction between the resist polymer and the additive in the first portion of the resist layer such to generate a reaction product in the first portion of the resist layer, and wherein the reaction product is insoluble in the developer solution; and (C) developing away the second portion of the resist layer by contacting the resist layer with the developer solution such that the second portion of the resist layer is replaced by voids in the resist layer.

12. The method of claim 11, further comprising the steps of:

(d) transferring the pattern in the resist layer to the material layer, by etching into the material layer through the voids in the resist layer; and (c) after step (d), removing the resist layer.

13. The method of claim 11, wherein the wavelength is 193 nm or less.

14. The method of claim 11, wherein the polymerizable backbone moiety, M, includes one of an acrylic structure and a cyclic olefinic structure, wherein the acrylic structure is:

wherein R3 represents one of hydrogen, an alkyl group of 1 to 20 carbons, a semi- or perfluorinated alkyl group of 1 to 20 carbons, and CN, and wherein the cyclic olefinic structure is:

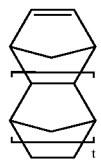

wherein t is an integer from 0 to 3.

15. The method of claim 11, wherein Q comprises at least one alicyclic structure.

16. The method of claim 11, wherein the substrate comprises a semiconductor wafer.

17. The method of claim 11, said composition further comprising at least one of a solvent and quencher.

* * * * *